(12) United States Patent
Ramaswamy et al.

(10) Patent No.: US 12,125,689 B2
(45) Date of Patent: Oct. 22, 2024

(54) METHODS AND APPARATUS FOR TOROIDAL PLASMA GENERATION

(71) Applicant: Applied Materials, Inc., Santa Clara, CA (US)

(72) Inventors: Kartik Ramaswamy, San Jose, CA (US); Andrew Nguyen, San Jose, CA (US); Yang Yang, Cupertino, CA (US); Sathya Ganta, Sunnyvale, CA (US); Fernando Silveira, Livermore, CA (US); Yue Guo, Redwood City, CA (US); Lu Liu, Campbell, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 41 days.

(21) Appl. No.: 17/940,513

(22) Filed: Sep. 8, 2022

(65) Prior Publication Data

US 2024/0087859 A1 Mar. 14, 2024

(51) Int. Cl.
*H01J 37/32* (2006.01)

(52) U.S. Cl.
CPC .. *H01J 37/32862* (2013.01); *H01J 37/32082* (2013.01); *H01J 2237/334* (2013.01)

(58) Field of Classification Search
CPC .......... H01J 37/32862; H01J 37/32082; H01J 37/321; H01J 2237/334
See application file for complete search history.

(56) References Cited

U.S. PATENT DOCUMENTS

| | | | |
|---|---|---|---|
| 6,237,526 | B1 | 5/2001 | Brcka |
| 9,313,872 | B2 | 4/2016 | Yamazawa et al. |
| 9,706,634 | B2 | 7/2017 | Liang et al. |
| 10,388,493 | B2 | 8/2019 | Singh et al. |
| 2007/0212811 | A1 | 9/2007 | Hanawa et al. |
| 2012/0164834 | A1 | 6/2012 | Jennings et al. |
| 2013/0026159 | A1 | 1/2013 | Shi |
| 2016/0322242 | A1 | 11/2016 | Nguyen et al. |
| 2016/0351404 | A1* | 12/2016 | Aramaki ........... H01J 37/32715 |
| 2019/0006587 | A1 | 1/2019 | Gilchrist et al. |
| 2019/0215943 | A1* | 7/2019 | Jevtic ....................... H05H 1/30 |
| 2019/0272999 | A1* | 9/2019 | Cho ................... H01L 21/32136 |
| 2020/0287258 | A1 | 9/2020 | Stowell et al. |

(Continued)

OTHER PUBLICATIONS

PCT International Search Report and Written Opinion for PCT/US2023/031985 dated Dec. 20, 2023.

*Primary Examiner* — Binh X Tran (74) *Attorney, Agent, or Firm* — MOSER TABOA (57) ABSTRACT

Methods and apparatus for forming plasma in a process chamber use an annular exciter formed of a first conductive material with a first end electrically connected to an RF power source that provides RF current and a second end connected to a ground and an annular applicator, physically separated from the annular exciter, formed of a second conductive material with at least one angular split with an angle forming an upper overlap portion and a lower overlap portion separated by a high K dielectric material which is configured to provide capacitance in conjunction with an inductance of the annular applicator to form a resonant circuit that is configured to resonate when the annular exciter flows RF current that inductively excites the annular applicator to a resonant frequency which forms azimuthal plasma from the annular applicator.

20 Claims, 5 Drawing Sheets

(56) References Cited

U.S. PATENT DOCUMENTS

| | | | |
|---|---|---|---|
| 2021/0159055 A1* | 5/2021 | Aramaki | C23C 16/4586 |
| 2022/0068604 A1* | 3/2022 | Kubota | H01J 37/32174 |
| 2022/0406565 A1* | 12/2022 | Chen | C23C 16/45536 |
| 2024/0047181 A1* | 2/2024 | Nakatani | H01J 37/32091 |

* cited by examiner

METHODS AND APPARATUS FOR TOROIDAL PLASMA GENERATION

FIELD

Embodiments of the present principles generally relate to semiconductor chambers used in semiconductor processes.

BACKGROUND

During deposition and etching in process chambers, unwanted material may buildup on the inside of the process chambers. Sometimes the buildup is caused by actual sputter deposits while other materials may be the result of chemistries used during the processing. The unwanted deposits may alter the desired performance of the deposition or etching processes. The inventors have observed that if the process chamber can be cleaned and maintained without dismantling the process chamber or replacing expensive process kit components, yields may be increased and at reduced costs. The inventors have also observed that better control over the deposition thicknesses would also yield higher performing structures formed on the substrates.

Thus, the inventors have provided improved methods and apparatus to produce an azimuthal plasma source that can be used to clean and also influence deposition thicknesses and etching processes.

SUMMARY

Methods and apparatus for wirelessly generating azimuthal plasma in a process chamber are provided herein.

In some embodiments, an apparatus for forming plasma in a process chamber may comprise an annular exciter formed of a first conductive material with a first end electrically connected to an RF power source that provides RF current and a second end connected to a ground and an annular applicator, physically separated from the annular exciter, formed of a second conductive material with at least one angular split with an angle forming an upper overlap portion and a lower overlap portion separated by a high K dielectric material which is configured to provide capacitance in conjunction with an inductance of the annular applicator to form a resonant circuit that is configured to resonate when the annular exciter flows RF current that inductively excites the annular applicator to a resonant frequency which forms azimuthal plasma from the annular applicator.

In some embodiments, the apparatus may further include wherein the angle is approximately 1 degree to approximately 4 degrees, wherein the high K dielectric material has a thickness of approximately 1 micron or greater which separates the at least one angular split by approximately 1 micron or greater, wherein the RF power source provides from greater than zero to approximately 5 kW of power to the annular exciter, wherein the annular exciter is positioned below the annular applicator, wherein the first conductive material and the second conductive material are aluminum, wherein the high K dielectric material is coated onto at least a portion of the annular applicator, wherein the high K dielectric material is an insulator that is positioned between the upper overlap portion and the lower overlap portion, wherein the annular exciter and the annular applicator are embedded into a ceramic material, wherein the annular exciter and the annular applicator are positioned in a baffle that surrounds a substrate support of the process chamber, and/or where the apparatus has multiple annular exciters or multiple annular applicators.

In some embodiments, a method of forming plasma in a process chamber may comprise energizing an annular exciter with an RF power source, wherein the annular exciter is formed of a first conductive material with a first end electrically connected to the RF power source to provide RF current and a second end connected to a ground and inductively coupling the annular exciter to an annular applicator to generate azimuthal plasma from the annular applicator, wherein the annular applicator is physically separated from the annular exciter and formed of a second conductive material with at least one angular split with an angle forming an upper overlap portion and a lower overlap portion separated by a high K dielectric material which is configured to provide capacitance in conjunction with an inductance of the annular applicator to form a resonant circuit that is configured to resonate at a resonant frequency when the annular exciter inductively couples to the annular applicator.

In some embodiments, the method may further include cleaning a surface of a process chamber by energizing the annular exciter and exciting the resonant frequency within the annular applicator to form plasma to remove depositions from the surface, altering deposition thickness of a deposition material on a substrate by energizing the annular exciter and exciting the resonant frequency within the annular applicator to form plasma, altering deposition thickness of a deposition material on an edge of the substrate by energizing the annular exciter and exciting the resonant frequency within the annular applicator to form plasma, wherein the annular exciter and the annular applicator surround a substrate support of the process chamber, tuning the azimuthal plasma by adjusting an amount of overlap of the upper overlap portion and the lower overlap portion, by adjusting a width of the annular applicator, by adjusting a thickness of the high K dielectric material between the upper overlap portion and the lower overlap portion, or by adjusting an amount of RF power applied to the annular exciter, wherein the annular exciter and the annular applicator are embedded in a ceramic material of a baffle that surrounds a substrate support in the process chamber, and/or adjusting the angle to alter the resonant frequency of the annular applicator based on a frequency of RF power applied to the annular exciter.

In some embodiments, a non-transitory, computer readable medium having instructions stored thereon that, when executed, cause a method of forming plasma in a process chamber to be performed, the method may comprise energizing an annular exciter with an RF power source, wherein the annular exciter is formed of a first conductive material with a first end electrically connected to the RF power source to provide RF current and a second end connected to a ground and inductively coupling the annular exciter to an annular applicator to generate azimuthal plasma from the annular applicator, wherein the annular applicator is physically separated from the annular exciter and formed of a second conductive material with at least one angular split with an angle forming an upper overlap portion and a lower overlap portion separated by a high K dielectric material which is configured to provide capacitance in conjunction with an inductance of the annular applicator to form a resonant circuit that is configured to resonate at a resonant frequency when the annular exciter inductively couples to the annular applicator.

In some embodiments, the non-transitory, computer readable medium may further comprise a method that includes altering deposition thickness of a deposition material on an edge of a substrate by energizing the annular exciter and exciting the resonant frequency within the annular applicator to form plasma, wherein the annular exciter and the annular applicator surround a substrate support of the process chamber, tuning the azimuthal plasma by adjusting an amount of overlap of the upper overlap portion and the lower overlap portion, by adjusting a width of the annular applicator, by adjusting a thickness of the high K dielectric material between the upper overlap portion and the lower overlap portion, or by adjusting an amount of RF power applied to the annular exciter, and/or adjusting the angle to alter the resonant frequency of the annular applicator based on a frequency of RF power applied to the annular exciter.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus provide wireless generation of azimuthal plasma in a process chamber. In some embodiments, the inductive plasma may be local to a wafer edge by wirelessly transferring RF power to a resonant annular applicator with the assistance of an annular exciter. The annular applicator eliminates the use of discrete lumped capacitors and creates equivalent capacitance by overlapping metal portions, as the annular applicator makes a circle. The diameter of the resulting metal ring of the annular applicator forms an equivalent inductance that resonates with the equivalent capacitance. The methods and apparatus can be used to create plasma around a wafer that can be used to clean polymer depositions and the like in the baffle area, to modulate the local processing volume plasma sheath at a wafer's edge, and/or to create effective radicals and densities at the wafer edge.

The present principles have the advantage of providing a locally generated, inductively coupled plasma close to a wafer's edge in the form of an azimuthally toroidal plasma. The annular applicator may be a single one-turn low profile resonant plasma applicator with no power leads required, allowing for optimal placement and retrofitting without requiring power runs to the annular applicator. The annular applicator also has the benefit of providing a resonant structure that is excited by an azimuthal electric field inductively generated by an oscillating axial magnetic field from an annular exciter. The annular applicator, when excited at a resonant frequency, sees a current amplification due to resonance generated by the oscillating axial magnetic field (B-field) which in turn creates an azimuthal plasma about the annular applicator. The generation of a local inductive plasma is very effective in cleaning hard to get polymer in the process kit wafer interface and modulating the sheath of processing volume plasma. In addition, the overlap, the overlap separation distance, and/or the width of the annular applicator can be varied to generate different values of effective capacitance. The diameter of the annular applicator may also be varied to generate different values of effective inductance to allow the annular applicator to resonate at a desired frequency for a given RF power source. The annular applicator and annular exciter may also be embedded in a ceramic baffle or ceramic support surface of a substrate support and the like to simplify installation.

The exciter circuit provided by the annular exciter can be a single turn or multiple turn inductive loop or an element capacitively coupled to the applicator from the exciter. The resonant applicator forms an equivalent capacitance by overlapping portions of the discrete metal structure formed by an angular split through the annular applicator from a top surface of the annular applicator to a bottom surface of the annular applicator to form an upper overlap portion and a lower overlap portion while the annular applicator still forms a ring or annular structure from a top view (see, e.g., FIG. 4). The resonant frequency can be tailored, for example, by adjusting a diameter of the annular applicator (equivalent inductance value) and/or the amount of overlap of the upper overlap portion and the lower overlap portion of the annular applicator (equivalent capacitance value).

Figure 1:
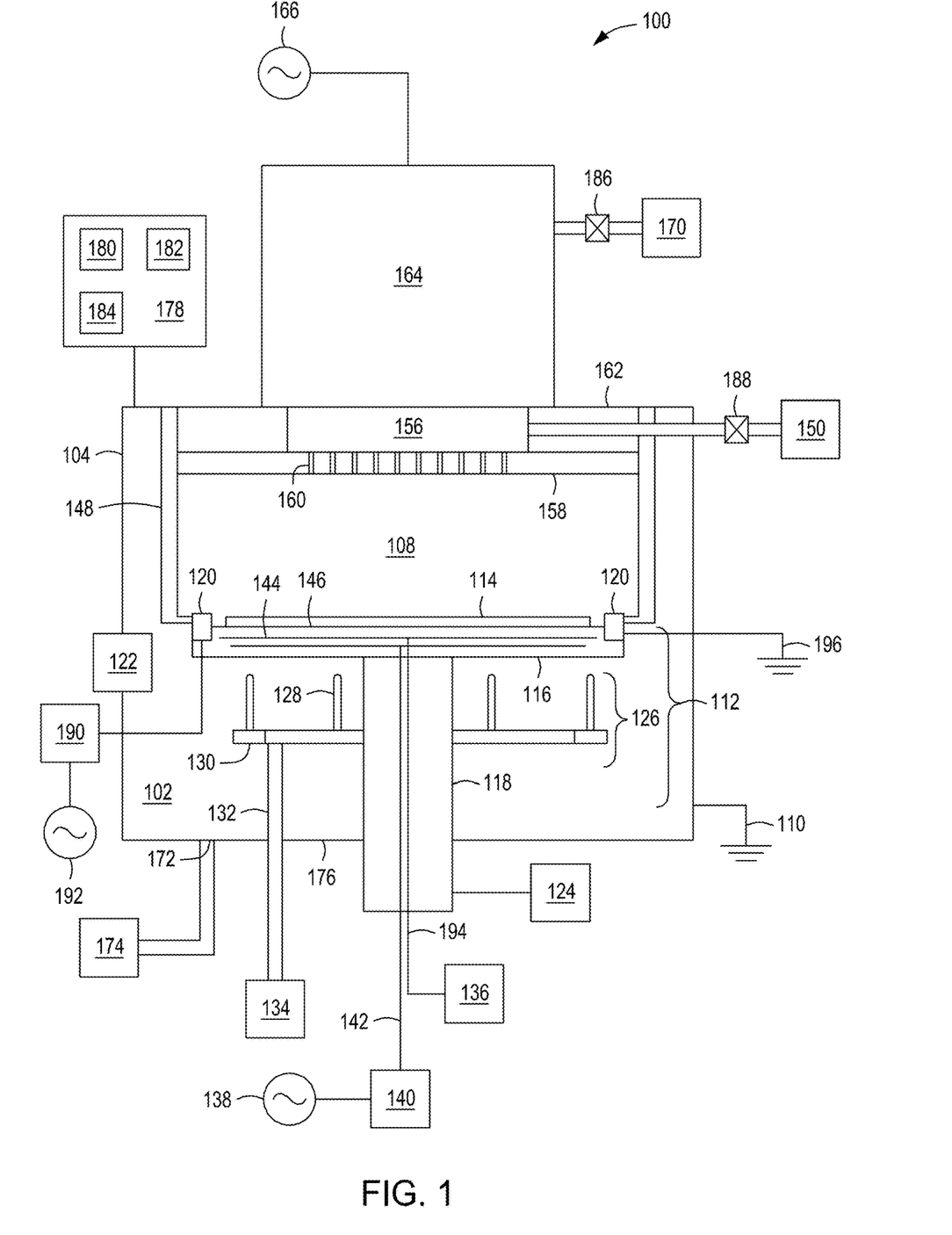
FIG. 1 depicts a schematic cross-sectional view of a process chamber in accordance with some embodiments of the present principles.

The methods and apparatus may be used in different types of process chambers such as deposition chambers or etch chambers and the like. In some embodiments, the process chambers may use chemistry for the processing and/or use local plasma and/or remote plasma for the processing. As an example chamber use and not meant to be limiting, FIG. 1 depicts a cross-sectional view of a process chamber 100 with a remote plasma source 164 in accordance with some embodiments. The process chamber 100 is a vacuum chamber which is adapted to maintain sub-atmospheric pressures within an interior volume 102 during substrate processing. In some embodiments, the process chamber 100 can maintain a pressure of approximately 1 mTorr to 100 Torr. The process chamber 100 includes a chamber body 106 which encloses a processing volume 108 located in the upper half of the interior volume 102. The chamber body 104 may be made of metal, such as aluminum and the like. The chamber body 104 may be grounded via a coupling to ground 110.

A substrate support 112 is disposed within the interior volume 102 to support and retain a substrate 114, such as a semiconductor wafer, for example, or other such substrate. The substrate support 112 may generally comprise a pedestal 116 and a hollow support shaft 118 for supporting the pedestal 116. The pedestal 116 may be composed of an aluminum-based material or a ceramic-based material and the like. A pedestal formed of a ceramic-based material may be used for high temperature processes. The hollow support shaft 118 provides a conduit to provide, for example, backside gases, process gases, fluids, coolants, power, or the like, to the pedestal 116. In some embodiments, the substrate support 112 includes a baffle 120 disposed about the pedestal 116. In some embodiments, the baffle 120 is made of ceramic-based materials. The ceramic-based material facilitates high pressure process capabilities. In some embodiments, the baffle 120 may include an annular excitor and an annular applicator discussed in detail below (see, e.g., FIG. 2). The annular exciter in the baffle 120 may be in electrical contact with an RF exciter power source 192 via a match network 190A and also in electrical contact with an annular exciter ground 196. The RF exciter power source 192 may supply up to approximately 5 kW of power. A slit valve 122 may be coupled to the chamber body 104 to facilitate in transferring the substrate 114 into and out of the interior volume 102.

In some embodiments, the hollow support shaft 118 is coupled to a lift actuator 124, such as a motor, which provides vertical movement of the pedestal 116 between an upper, processing position, and a lower, transfer position. A substrate lift 126 can include lift pins 128 mounted on a platform 130 connected to a shaft 132 which is coupled to a second lift actuator 134 for raising and lowering the substrate lift 126 so that the substrate 114 may be placed on or removed from the pedestal 116. The pedestal 116 may include through-holes to receive the lift pins 128. The hollow support shaft 118 provides a path for a gas conduit 194 for coupling a backside gas supply 136 and/or an RF power supply 138 to the pedestal 116. In some embodiments, the RF power supply 138 provides bias power through a matching network 140 to a power conduit 142 to the pedestal 116. In some embodiments, RF energy supplied by the RF power supply 138 may have a frequency of about 2 MHz or greater. In some embodiments, the RF power supply 138 may have a frequency of about 13.56 MHz.

In some embodiments, the backside gas supply 136 is disposed outside of the chamber body 104 and supplies gas to the pedestal 116. In some embodiments, the pedestal 116 includes a gas channel 144, allowing gas to interact with a backside of the substrate 114 to maintain a given temperature. The gas channel 144 is configured to provide backside gas, such as nitrogen (N), argon (Ar), or helium (He), to an upper surface 146 of the pedestal 116 to act as a heat transfer medium. The gas channel 144 is in fluid communication with the backside gas supply 136 via gas conduit 194 to control the temperature and/or temperature profile of the substrate 114 during use. For example, the backside gas supply 136 can supply gas to cool and/or heat the substrate 1114 during use. In some embodiments, the substrate 114 may be heated from approximately 60 degrees Celsius to approximately 450 degrees Celsius.

The process chamber 100 includes a process kit circumscribing various chamber components to prevent unwanted reaction between such components and contaminants. The process kit includes an upper shield 148. In some embodiments, the upper shield 148 may be made of metal, such as aluminum. In some embodiments, the process kit may be constructed of quartz. In some embodiments, a mixing reservoir 156 is coupled to and in fluid communication with the processing volume 108. The mixing reservoir 156 is also fluidly connected to the RPS 164. The mixing reservoir 156 allows mixing of the plasma gases with other gases provided by a gas delivery system 150. A rate of flow of the other gases from the gas delivery system 150 may be controlled by a first flow valve 188.

A showerhead 158 is located above the processing volume 108 and below a ceiling 162 of the chamber body 104. The showerhead 158 includes through-holes 160 to flow gases from the mixing reservoir 156 into the processing volume 108. The RPS 164 is fluidly connected to the mixing reservoir 156 to allow ionized gases to flow from the RPS 164 into the mixing reservoir 156, through the showerhead 158, and into the processing volume 108. Plasma is generated in the RPS 164 by a plasma RF power source 166 that provides RF energy to the RPS 164. Process gases used to form the plasma are supplied by a process gas source 170 and controlled by a second flow valve 186. The plasma gases supplied by the process gas source 170 may include, but are not limited to, hydrogen, helium, and/or argon and the like. The RPS 164 produces ions and radicals of the process gas to facilitate in processing the substrate 114.

A pump port 172 is configured to facilitate removal of particles and gases from the interior volume 102. The process chamber 100 is coupled to and in fluid communication with a vacuum system 174 which includes a throttle valve (not shown) and pump (not shown) which are used to exhaust the process chamber 100. In some embodiments, the vacuum system 174 is coupled to the pump port 172 disposed on a bottom surface 176 of the chamber body 104. The pressure inside the process chamber 100 may be regulated by adjusting the throttle valve and/or vacuum pump. In some embodiments, the pump has a flow rate of approximately 1900 liters per second to approximately 3000 liters per second. In some embodiments, the vacuum system 174 may be used to facilitate in regulating the substrate temperature.

In some embodiments, a controller 178 is used for the operation of the process chamber 100. The controller 178 may use direct control of the process chamber 100 or alternatively, use indirect control of the process chamber 100 by controlling computers (or controllers) associated with the process chamber 100. In operation, the controller 178 enables data collection and feedback from the process chamber 100 to optimize performance of the process chamber 100. The controller 178 generally includes a Central Processing Unit (CPU) 180, a memory 182, and a support circuit 184. The CPU 180 may be any form of a general-purpose computer processor that can be used in an industrial setting. The support circuit 184 is conventionally coupled to the CPU 180 and may comprise a cache, clock circuits, input/output subsystems, power supplies, and the like. Software routines, such as a method as described below may be stored in the memory 182 and, when executed by the CPU 180, transform the CPU 180 into a specific purpose computer (controller 178). The software routines may also be stored and/or executed by a second controller (not shown) that is located remotely from the process chamber 100. The controller 178 may be used to adjust the RF power and/or frequency to the annular exciter (discussed below) to adjust the plasma formation about the annular applicator (discussed below).

The memory 182 is in the form of computer-readable storage media that contains instructions, when executed by the CPU 180, to facilitate the operation of the semiconductor processes and equipment. The instructions in the memory 182 are in the form of a program product such as a program that implements the method of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Figure 2:
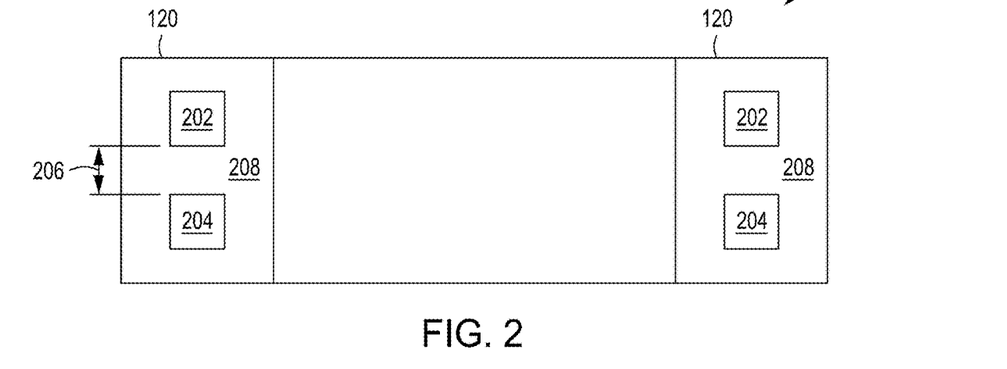
FIG. 2 depicts a schematic cross-sectional view of a baffle in accordance with some embodiments of the present principles.
Figure 3:
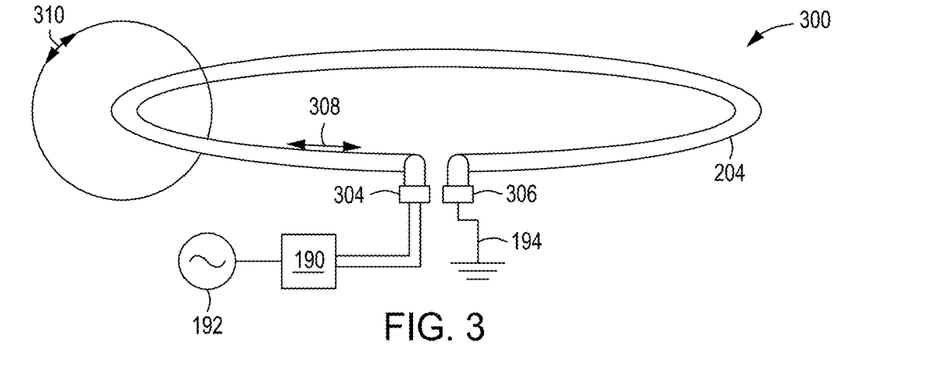
FIG. 3 depicts an isometric view of an annular exciter in accordance with some embodiments of the present principles.

FIG. 2 depicts a cross-sectional view 200 of the baffle 120 in accordance with some embodiments. An annular exciter 204 is embedded in an insulative material 208 of the baffle 120 such as, but not limited to, a ceramic material (e.g., alumina). The annular exciter 204 has a first end 304 connected to the RF exciter power source 192 via the match network 190 and a second end 306 connected to the exciter ground 194 as depicted in a view 300 of FIG. 3. In some embodiments, the annular exciter 204 may include multiple turns (not shown) or a single turn as depicted in FIG. 3. Current 308 oscillates in the annular exciter 204 and creates an oscillating axial B-field 310 which in turn wirelessly supplies power to form an azimuthal plasma about the annular applicator 202, as the annular exciter 204 and the annular applicator 202 are physically separated. The RF exciter power source 192 may provide up to 5 kW of power to the annular exciter 204. In some embodiments, the annular exciter 204 may be positioned below the annular applicator 202 as depicted in FIG. 2 or concentrically positioned within the annular applicator 202 or concentrically around an outside of the annular applicator 202 (not shown in FIG. 2). In some embodiments, the annular exciter 204 may be positioned above the annular applicator 202 (not shown in FIG. 2).

Figure 4:
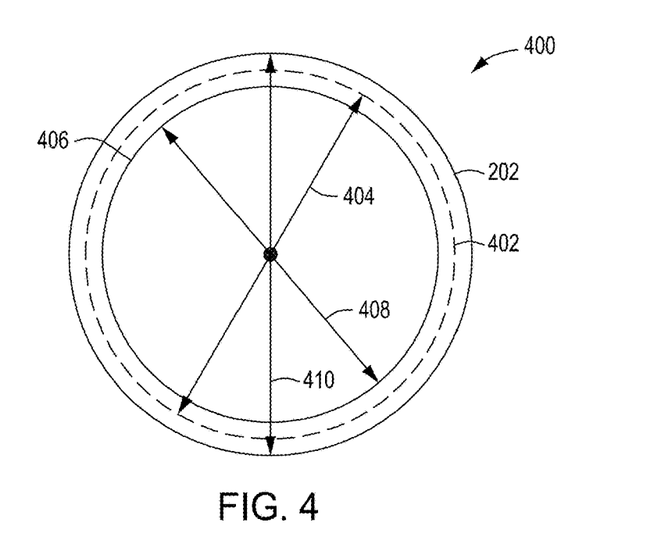
FIG. 4 depicts a top-down view of an annular applicator in accordance with some embodiments of the present principles.

The annular applicator 202 has a ring-like shape as depicted in a top-down view 400 of FIG. 4. A mid-point circle 402 (midway between an inner diameter 408 and an outer diameter 410 of the annular applicator) may be used for determining a diameter 404 of the annular applicator 202 along with the cross-sectional area of the annular applicator 202 when calculating an equivalent inductance value formed by the annular applicator 202. At least one angular split 406 (see, e.g., FIG. 5) may be formed through the annular applicator 202 to create equivalent capacitance in the annular applicator 202. The amount of equivalent capacitance and equivalent inductance provided by the annular applicator 202 determines the resonant frequency ($f_r = 1/(2 \times \pi \times \sqrt{(L \times C)})$) of the annular applicator 202. Adjusting the equivalent inductance and/or capacitance allows for different resonant frequencies. As depicted in a cross-sectional view 500 of FIG. 5 of the annular applicator 202, the equivalent capacitance is formed by the at least one angular split 406 having an overlap angle 504 through the annular applicator 202 to form a top overlap portion 508 and a bottom overlap portion 510.

Figure 5:
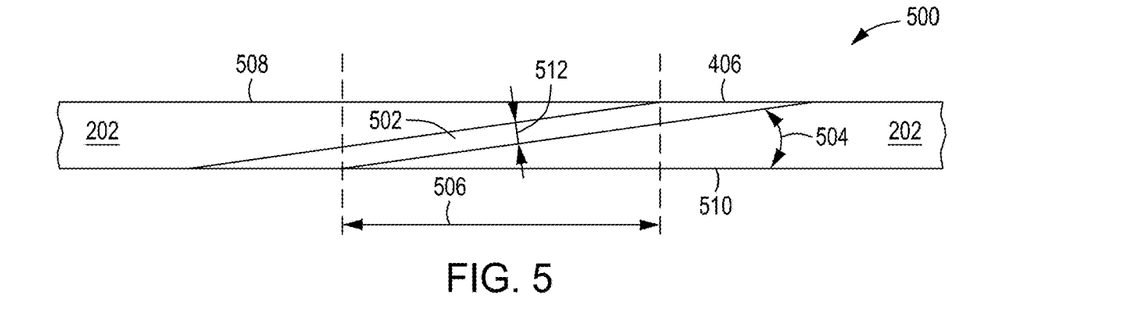
FIG. 5 depicts a partial side view of an annular applicator in accordance with some embodiments of the present principles.

A high K dielectric material 502 is formed between the top overlap portion 508 and the bottom overlap portion 510 with a dielectric thickness 512. The term "high K dielectric material" as used herein refers to a dielectric material with a high dielectric constant (K, Kappa) as compared to silicon dioxide (e.g., In some embodiments K is greater than 3.9. In some embodiments, K is greater than 7.). In some embodiments, the dielectric thickness 512 may be approximately 1 micron or greater. An overlap area 506 determines the amount of equivalent capacitance formed by the annular applicator 202. In some embodiments, more than one angular split may be formed in the annular applicator 202 to increase the equivalent capacitance without requiring additional traditional type capacitor banks. The overlap angle 504 may also be used as a tuning knob to adjust the resonant frequency of the annular applicator 202. For example, a very high electric field at a desired frequency can be achieved by adjusting the overlap angle 504 for a given process chamber design. The resonant characteristics of the annular applicator 202 amplifies the current induced by the annular exciter 204 to provide a high azimuthal electric field for generation of plasma. The equivalent capacitance elements (angular splits separated by dielectric material) of the annular applicator 202 are able to operate under high levels of current unlike traditional discrete capacitors.

Figure 6:
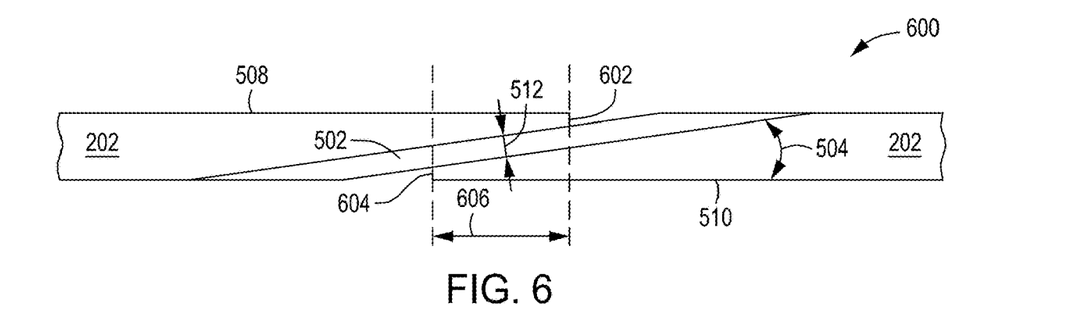
FIG. 6 depicts a partial side view of an annular applicator with a reduced overlap in accordance with some embodiments of the present principles.
Figure 7:
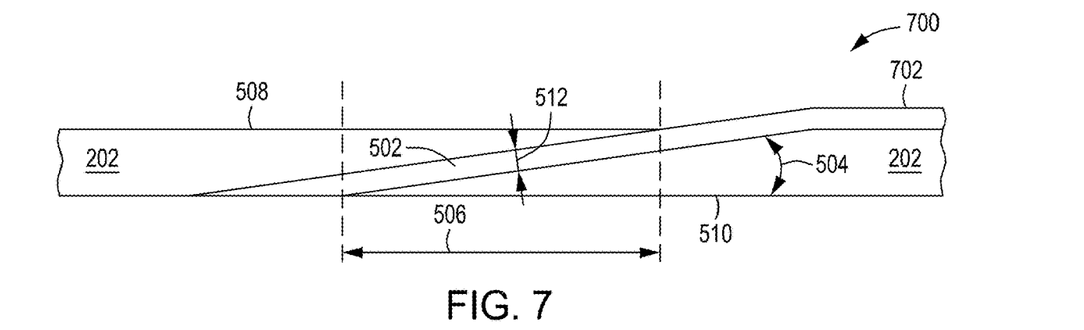
FIG. 7 depicts a partial side view of an annular applicator with a dielectric coating in accordance with some embodiments of the present principles.
Figure 8:
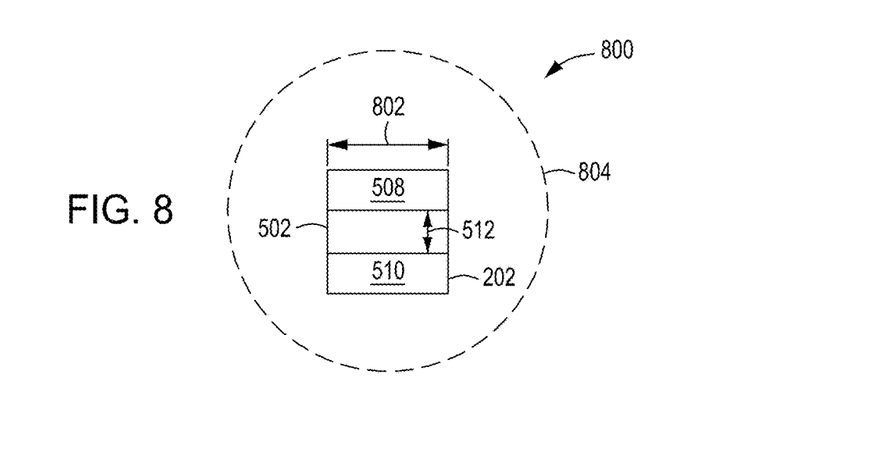
FIG. 8 depicts a cross-sectional view of an annular applicator in accordance with some embodiments of the present principles.

In a cross-section view 600 of FIG. 6, a top end 602 of the top overlap portion 508 has been reduced in length and a bottom end 604 of the bottom overlap portion has been reduced in length to reduce the overlap area 506 to a reduced overlap area 606. In a cross-sectional view 700 of FIG. 7, the high K dielectric material 502 is formed by applying a coating 702 to the bottom overlap portion 510 or more of the annular applicator 202. In some embodiments, the coating 702 may also be applied to the top overlap portion 508 or more of the annular applicator 202, alone or in conjunction with a coating on the bottom overlap portion 510. The equivalent capacitance of the annular applicator 202 can be adjusted by the amount of overlap area 506, a width 802 of the annular applicator 202, and the dielectric thickness 512 as depicted in a cross-sectional view 800 of FIG. 8 (and also FIGS. 5-7). When the annular applicator 202 is excited by the oscillating B-field generated by the annular exciter 204, an azimuthal electric field 804 is formed about the annular applicator 202 which generates azimuthally toroidal plasma along the annular applicator 202. The resulting electric fields of the annular applicator 202 are generated by the induced current which is magnified when operating the annular applicator 202 at the resonant frequency. The amount of applied power supplied to the annular exciter 204 can also be used to adjust the plasma generated by the annular applicator 202.

Figure 9:
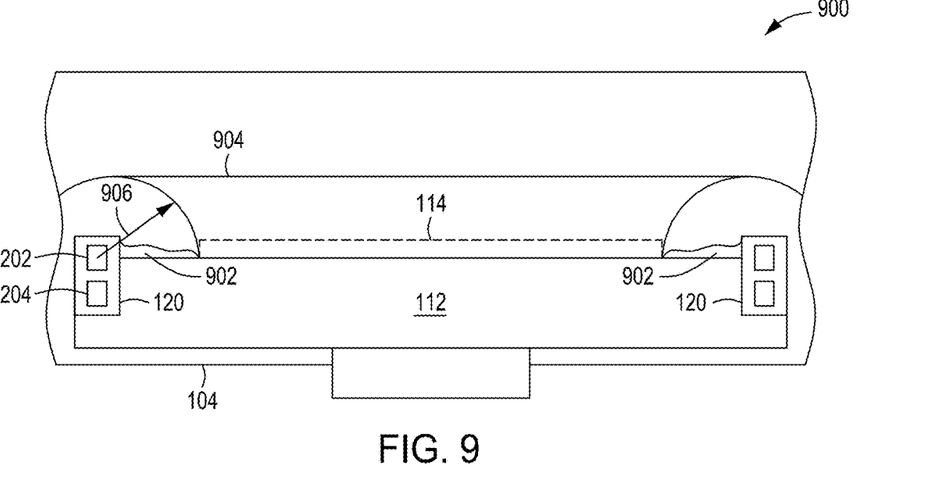
FIG. 9 depicts a cross-sectional view of a process chamber with an annular applicator producing toroidal plasma to clean the process chamber in accordance with some embodiments of the present principles.
Figure 10:
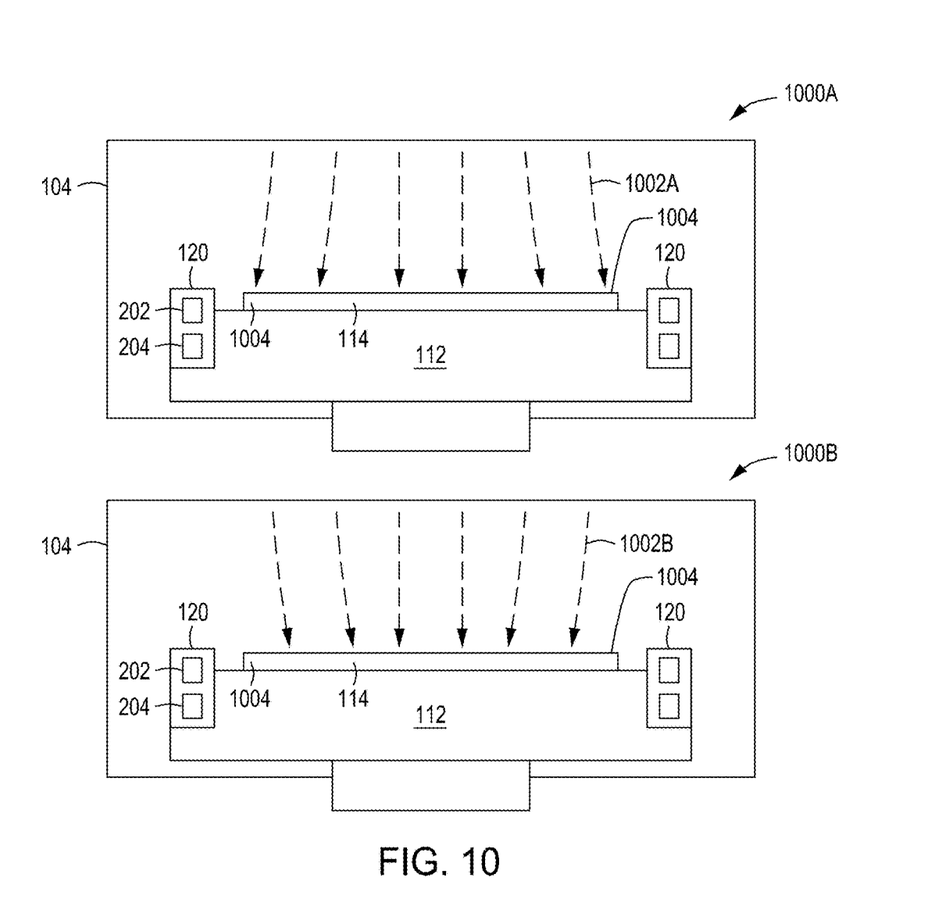
FIG. 10 depicts a cross-sectional view of a process chamber with an annular applicator increasing or decreasing ion density near an edge of a substrate in accordance with some embodiments of the present principles.
Figure 11:
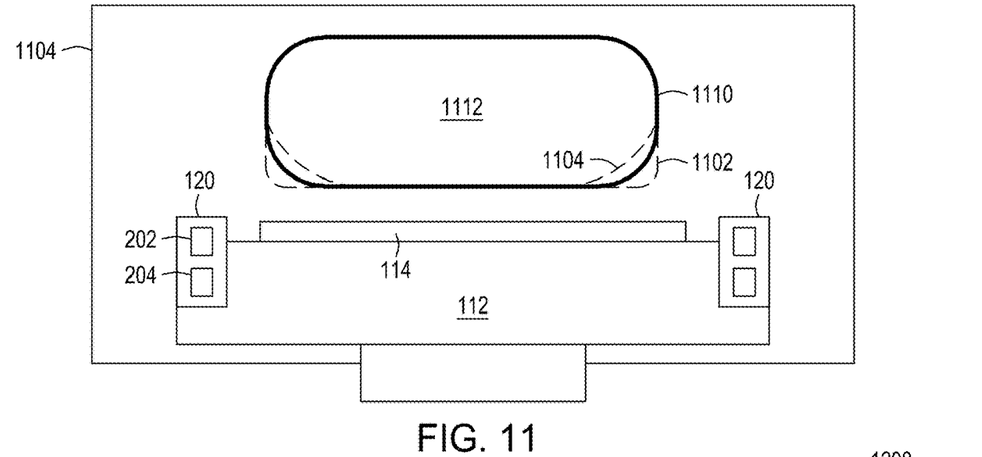
FIG. 11 depicts a cross-sectional view of a process chamber with an annular applicator influencing a sheath of local plasma in a processing volume in accordance with some embodiments of the present principles.

In a cross-sectional view 900 of the chamber body 104 of FIG. 9, the baffle 120 is configured with the annular exciter 204 which excites the annular applicator 202 to form azimuthally toroidal plasma 904 along the annular applicator to clean deposits 902 (e.g., polymer or other process depositions, etc.) from the substrate support 112. The radius 906 of the azimuthally toroidal plasma 904 can be adjusted by altering the amount of RF power applied to the annular exciter 204 in order to clean more or less of a surrounding surface. In a cross-sectional view 1000A of the chamber body 104 of FIG. 10, the baffle 120 is configured with the annular exciter 204 which excites the annular applicator 202 to form electric fields to generate plasma to increase ion density 1002A at the edge 1004 of the substrate 114. Similarly, as depicted in a cross-sectional view 1000B of FIG. 10, the electric fields and subsequently generated plasma may be decreased in order to decrease ion density 10026 at the edge 1004 of the substrate 114. The annular applicator 202 may also be used to influence a sheath 1110 of local plasma 1112 in the process chamber 1104 as depicted in a cross-sectional view 1100 of FIG. 11. The sheath 1110 may be influenced, for example, to a first position 1102 to increase edge depositions or etching of the substrate 114 or to a second position 1104 and the like to decrease edge depositions or etching of the substrate 114.

Figure 12:
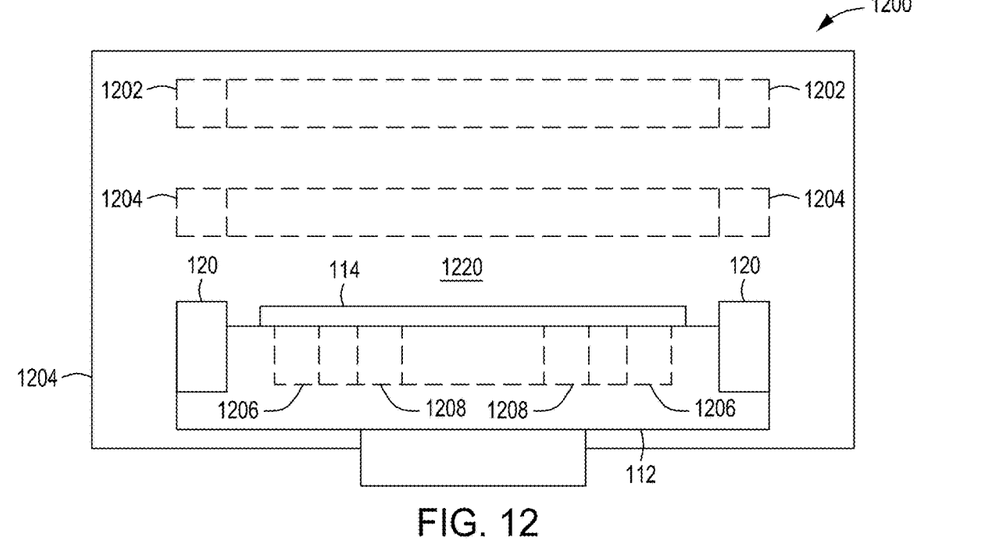
FIG. 12 depicts a cross-sectional view of a process chamber with various locations of one or more annular applicators in accordance with some embodiments of the present principles.

The methods and the apparatus of the present principles may also be used to adjust other processes parameters and the like. As such, the annular applicator and the annular excitor pair may be positioned in different locations within a process chamber and may also be used in conjunction with other pairs within the same process chamber as depicted in a cross-sectional view 1200 of FIG. 12. For example, a first annular applicator/exciter pair 1202 is positioned near a top of a processing volume 1220. A second annular applicator/exciter pair 1204 is positioned near a middle of the processing volume 1220. A third annular applicator/exciter pair 1206 is embedded into the substrate support 112 near an edge of the substrate 114 and a fourth annular applicator/exciter pair 1208 is embedded inward to the third annular applicator/exciter pair 1206. In some embodiments, the first annular applicator/exciter pair 1202 and the second annular applicator/exciter pair 1204 may be used to affect the directivity of ions and the like or even as primary plasma sources inside the processing volume 1220. In some embodiments, the third annular applicator/exciter pair 1206 and the fourth annular applicator/exciter pair 1208 may be used to influence the directivity of ions onto the other portions of the substrate 114 other than the edge region as described above with regard to annular applicator/exciter pair embedded in the baffle 120. The ease of installation and flexibility is especially useful in process chambers with metal bodies and lids that are not conducive to using external inductive coils for generating plasma, for example, to clean interior surfaces of the process chamber and the like. Although depicted as a single unit in FIG. 12, the annular applicator/exciter pairs may be installed separately as opposed to being embedded in a ceramic material to form a single unit for installation. In some embodiments, the annular applicator and the annular excitor are positioned within approximately one centimeter or less of each other for optimal energy transfer from the annular excitor to the annular applicator. In some embodiments, a tilting of the plane of the annual applicator relative to the plane of the annular exciter may occur to allow for easier installation, especially in retrofit situations. Transfer of energy still occurs, although at lower efficiency, as long as the tilt angle between the planes is less than 90 degrees.

Figure 13:
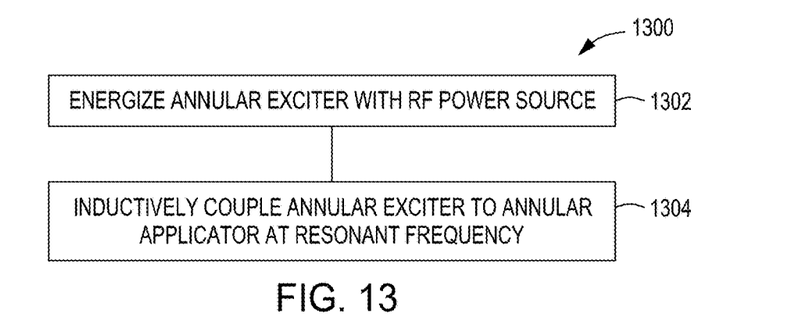
FIG. 13 is a method of wirelessly forming plasma in a process chamber in accordance with some embodiments of the present principles.

In FIG. 13, a method 1300 of forming plasma in a process chamber is depicted. In block 1302, an annular exciter is energized with an RF power source. The annular exciter is formed of a first conductive material such as, but not limited to, copper or aluminum and the like. The annular exciter has a first end that is connected to an RF power source that provides RF current to the annular exciter. The annular exciter has a second end that is connected to a ground to allow current flow. In some embodiments, the annular exciter may have multiple turns or loops. In block 1304, the annular exciter is inductively coupled to an annular applicator at a resonant frequency. The annular applicator is physically separated from the annular exciter and formed of a second conductive material with at least one angular split with an angle forming an upper overlap portion and a lower overlap portion separated by a high K dielectric material. The upper overlap portion, the lower overlap portion, and the high K dielectric material are configured to provide capacitance in conjunction with an inductance of the annular applicator to form a resonant circuit. The resonant circuit is configured to resonate at a resonant frequency when the annular exciter inductively couples to the annular applicator. In some embodiments, the annular exciter and the annular applicator may be embedded in a ceramic material of a baffle that surrounds a substrate support in the process chamber.

In some embodiments, the method 1300 may further include cleaning a surface of the process chamber by energizing the annular exciter and exciting the resonant frequency within the annular applicator to form plasma to remove depositions from the surface. In some embodiments, the method 1300 may further include altering the deposition thickness of a deposition material on a substrate by energizing the annular exciter and exciting the resonant frequency within the annular applicator to form plasma. In some embodiments, the method 1300 may further include altering deposition thicknesses of a deposition material on an edge of the substrate by energizing the annular exciter and exciting the resonant frequency within the annular applicator to form plasma where the annular exciter and the annular applicator surround a substrate support of the process chamber. In some embodiments, the method 1300 may further include tuning the azimuthal plasma by adjusting an amount of overlap of the upper overlap portion and the lower overlap portion, by adjusting a width of the annular applicator, by adjusting a thickness of the high K dielectric material between the upper overlap portion and the lower overlap portion, by adjusting an overlap angle of the annular applicator, and/or by adjusting an amount of RF power applied to the annular exciter. In some embodiments, the angle of the angled split may be adjusted to alter the resonant frequency of the annular applicator based on a frequency of RF power applied to the annular exciter by the annular exciter.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. An apparatus for forming plasma in a process chamber, comprising:
an annular exciter formed of a first conductive material with a first end electrically connected to an RF power source that provides RF current and a second end connected to a ground; and
an annular applicator, physically separated from the annular exciter, formed of a second conductive material with at least one angular split with an angle forming an upper overlap portion and a lower overlap portion separated by a high K dielectric material which is configured to provide capacitance in conjunction with an inductance of the annular applicator to form a resonant circuit that is configured to resonate when the annular exciter flows RF current that inductively excites the annular applicator to a resonant frequency which forms azimuthal plasma from the annular applicator.

2. The apparatus of claim 1, wherein the angle is approximately 1 degree to approximately 4 degrees.

3. The apparatus of claim 1, wherein the high K dielectric material has a thickness of approximately 1 micron or greater which separates the at least one angular split by approximately 1 micron or greater.

4. The apparatus of claim 1, wherein the RF power source provides from greater than zero to approximately 5 kW of power to the annular exciter.

5. The apparatus of claim 1, wherein the annular exciter is positioned below the annular applicator.

6. The apparatus of claim 1, wherein the first conductive material and the second conductive material are aluminum.

7. The apparatus of claim 1, wherein the high K dielectric material is coated onto at least a portion of the annular applicator.

8. The apparatus of claim 1, wherein the high K dielectric material is an insulator that is positioned between the upper overlap portion and the lower overlap portion.

9. The apparatus of claim 1, wherein the annular exciter and the annular applicator are embedded into a ceramic material.

10. The apparatus of claim 1, wherein the annular exciter and the annular applicator are positioned in a baffle that surrounds a substrate support of the process chamber.

11. The apparatus of claim 1 has multiple annular exciters or multiple annular applicators.

12. A method of forming plasma in a process chamber, comprising:
energizing an annular exciter with an RF power source, wherein the annular exciter is formed of a first conductive material with a first end electrically connected to the RF power source to provide RF current and a second end connected to a ground; and
inductively coupling the annular exciter to an annular applicator to generate azimuthal plasma from the annular applicator, wherein the annular applicator is physically separated from the annular exciter and formed of a second conductive material with at least one angular split with an angle forming an upper overlap portion and a lower overlap portion separated by a high K dielectric material which is configured to provide capacitance in conjunction with an inductance of the annular applicator to form a resonant circuit that is configured to resonate at a resonant frequency when the annular exciter inductively couples to the annular applicator.

13. The method of claim 12, further comprising:
cleaning a surface of a process chamber by energizing the annular exciter and exciting the resonant frequency within the annular applicator to form plasma to remove depositions from the surface.

14. The method of claim 12, further comprising:
altering deposition thickness of a deposition material on a substrate by energizing the annular exciter and exciting the resonant frequency within the annular applicator to form plasma.

15. The method of claim 14, further comprising:
altering deposition thickness of a deposition material on an edge of the substrate by energizing the annular exciter and exciting the resonant frequency within the annular applicator to form plasma, wherein the annular exciter and the annular applicator surround a substrate support of the process chamber.

16. The method of claim 12, further comprising:
tuning the azimuthal plasma by adjusting an amount of overlap of the upper overlap portion and the lower overlap portion, by adjusting a width of the annular applicator, by adjusting a thickness of the high K dielectric material between the upper overlap portion and the lower overlap portion, or by adjusting an amount of RF power applied to the annular exciter.

17. The method of claim 12, wherein the annular exciter and the annular applicator are embedded in a ceramic material of a baffle that surrounds a substrate support in the process chamber.

18. The method of claim 12, further comprising:
adjusting the angle to alter the resonant frequency of the annular applicator based on a frequency of RF power applied to the annular exciter.

19. A non-transitory, computer readable medium having instructions stored thereon that, when executed, cause a method of forming plasma in a process chamber to be performed, the method comprising:
energizing an annular exciter with an RF power source, wherein the annular exciter is formed of a first conductive material with a first end electrically connected to the RF power source to provide RF current and a second end connected to a ground; and
inductively coupling the annular exciter to an annular applicator to generate azimuthal plasma from the annular applicator, wherein the annular applicator is physically separated from the annular exciter and formed of a second conductive material with at least one angular split with an angle forming an upper overlap portion and a lower overlap portion separated by a high K dielectric material which is configured to provide capacitance in conjunction with an inductance of the annular applicator to form a resonant circuit that is configured to resonate at a resonant frequency when the annular exciter inductively couples to the annular applicator.

20. The non-transitory, computer readable medium of claim 19, further comprising:
altering deposition thickness of a deposition material on an edge of a substrate by energizing the annular exciter and exciting the resonant frequency within the annular applicator to form plasma, wherein the annular exciter and the annular applicator surround a substrate support of the process chamber;

tuning the azimuthal plasma by adjusting an amount of overlap of the upper overlap portion and the lower overlap portion, by adjusting a width of the annular applicator, by adjusting a thickness of the high K dielectric material between the upper overlap portion and the lower overlap portion, or by adjusting an amount of RF power applied to the annular exciter; or adjusting the angle to alter the resonant frequency of the annular applicator based on a frequency of RF power applied to the annular exciter.

* * * * *